(12) United States Patent
Moriwaki et al.

(10) Patent No.: US 11,600,652 B2
(45) Date of Patent: Mar. 7, 2023

(54) PHOTOELECTRIC CONVERSION PANEL AND METHOD FOR MANUFACTURING PHOTOELECTRIC CONVERSION PANEL

(71) Applicant: SHARP KABUSHIKI KAISHA, Sakai (JP)

(72) Inventors: Hiroyuki Moriwaki, Sakai (JP); Makoto Nakazawa, Sakai (JP); Tetsuya Tanishima, Sakai (JP); Rikiya Takita, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 128 days.

(21) Appl. No.: 17/341,894

(22) Filed: Jun. 8, 2021

(65) Prior Publication Data
US 2021/0391374 A1    Dec. 16, 2021

Related U.S. Application Data

(60) Provisional application No. 63/037,905, filed on Jun. 11, 2020.

(51) Int. Cl.
*H01L 27/146* (2006.01)
*G01T 1/20* (2006.01)
*H01L 29/786* (2006.01)

(52) U.S. Cl.
CPC ...... *H01L 27/14663* (2013.01); *G01T 1/2018* (2013.01); *H01L 27/14616* (2013.01); *H01L 27/14689* (2013.01); *H01L 29/7869* (2013.01); *H01L 29/78636* (2013.01)

(58) Field of Classification Search
CPC ......... H01L 27/14663; H01L 27/14616; H01L 27/14689; H01L 29/78636; H01L 29/7869; H01L 27/1214; H01L 27/1225; H01L 27/14612; H01L 27/14692; G01T 1/2018
See application file for complete search history.

(56) References Cited

U.S. PATENT DOCUMENTS

| 10,811,457 B2 * | 10/2020 | Na ..................... H01L 27/14689 |
| 11,094,738 B2 * | 8/2021 | Zhao ................. H01L 27/14692 |
| 2019/0296065 A1 | 9/2019 | Misaki et al. |

FOREIGN PATENT DOCUMENTS

JP    2019-169670 A    10/2019

\* cited by examiner

*Primary Examiner* — Seung C Sohn
(74) *Attorney, Agent, or Firm* — ScienBiziP, P.C.

(57) ABSTRACT

A photoelectric conversion panel includes: a thin film transistor; a first organic film formed in an upper layer with respect to the thin film transistor; a photoelectric conversion element formed in an upper layer with respect to the first organic film; a first inorganic layer formed so as to cover at least a part of the photoelectric conversion element, and to cover the first organic film; and a second organic film formed in an upper layer with respect to the first organic film, wherein the first inorganic layer is provided with a first through hole connecting the first organic film and the second organic film.

13 Claims, 12 Drawing Sheets

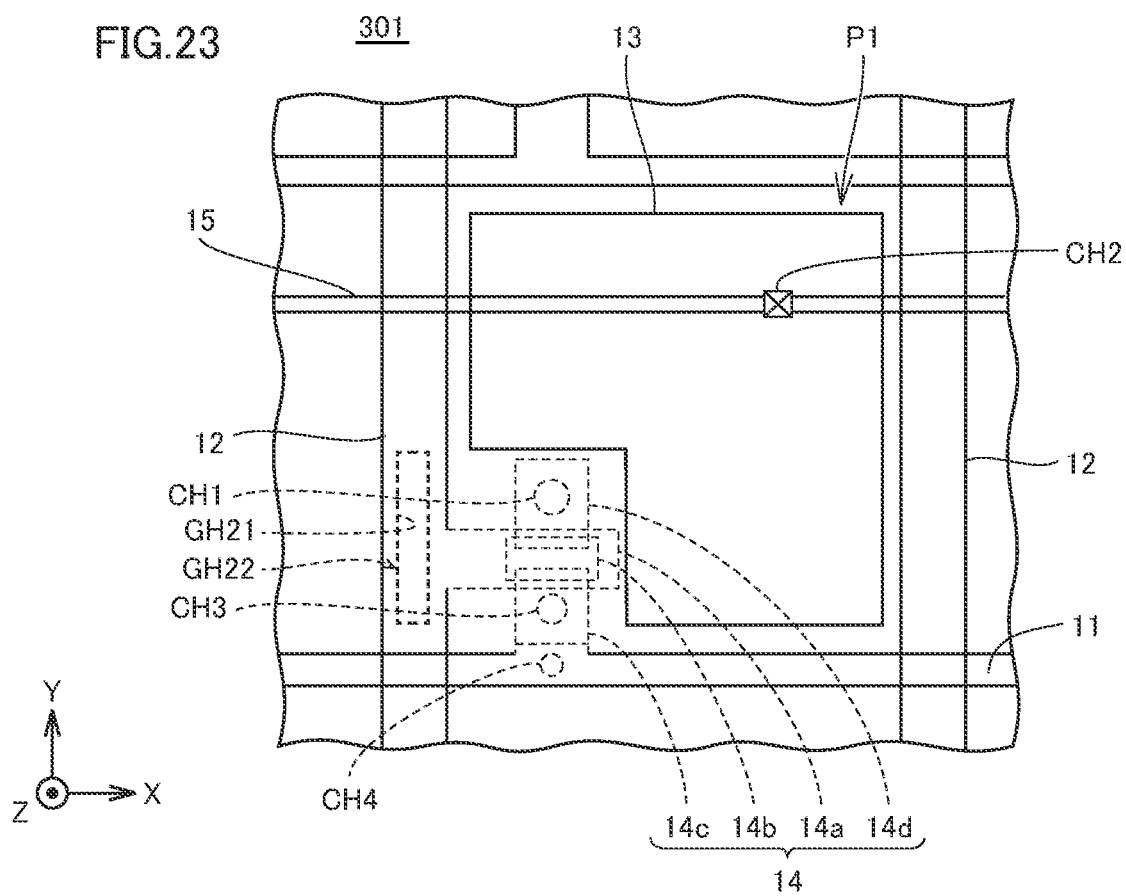

PHOTOELECTRIC CONVERSION PANEL AND METHOD FOR MANUFACTURING PHOTOELECTRIC CONVERSION PANEL

CROSS-REFERENCE TO RELATED APPLICATIONS

This application claims the benefit of priority to U.S. Provisional Application No. 63/037,905 filed on Jun. 11, 2020. The entire contents of the above-identified application are hereby incorporated by reference.

BACKGROUND

Technical Field

The present disclosure relates to a photoelectric conversion panel and a method for manufacturing a photoelectric conversion panel.

Conventionally, a photoelectric conversion panel including thin film transistors and photoelectric conversion elements has been known. Such a photoelectric conversion panel is disclosed in, for example, JP-A-2019-169670.

JP-A-2019-169670 discloses an active matrix substrate that includes: thin film transistors; a first organic film made of an organic transparent resin formed in an upper layer with respect to the thin film transistors; and photoelectric conversion elements. In this active matrix substrate, an inorganic insulating film is provided so as to cover a part of the first organic film and the photoelectric conversion elements. In this active matrix substrate, a second organic film made of an organic transparent resin is also provided so as to cover the inorganic insulating film.

SUMMARY

Here, a heating process (a baking process) is performed in a case where an organic film is formed when an active matrix substrate (a photoelectric conversion panel) is manufactured, though it is not described in the above-mentioned JP-A-2019-169670. It is therefore considered that, in the case where the photoelectric conversion panel including the first and second organic films as disclosed in JP-A-2019-169670 is manufactured, therefore, the inorganic insulating film is formed after the first organic film is formed, and thereafter, the second organic film is formed by performing a heating process. In this case, heat generated in the heating process is transmitted via the inorganic insulating film to the first organic film. Therefore, when the first organic film already formed is heated, gas is generated in some cases from the first organic film. It is considered to be possible that the gas thus generated from the first organic film then pushes up the already-formed organic insulating film, thereby separating the inorganic insulating film from the first organic film (loosening the inorganic insulating film). This loosening of the inorganic insulating film is considered to result in that some of the elements provided in the photoelectric conversion panel are deformed or electric properties of the elements change in some cases. Besides, in the photoelectric conversion panel including the photoelectric conversion elements, the photoelectric conversion elements are thicker films, as compared with the other layers, and therefore, stress tends to occur to the substrate, which is considered to make the inorganic insulating film particularly in a state of easily separating. To cope with this, a photoelectric conversion panel, and a method for manufacturing a photoelectric conversion panel are desired that make it possible to restrain the inorganic insulating film (the first inorganic layer) from separating from a first organic film in the manufacture of the photoelectric conversion panel, even in a case where the photoelectric conversion panel includes the first organic film and a second organic film.

The present disclosure is intended to solve the above-described problem, and it is an object thereof to provide a photoelectric conversion panel and a method for manufacturing a photoelectric conversion panel that make it possible to restrain a first inorganic layer from separating from a first organic film in the manufacture of the photoelectric conversion panel, even in a case where the photoelectric conversion panel includes the first organic film and a second organic film.

To achieve the above-described object, a photoelectric conversion panel in a first aspect disclosed below includes: a thin film transistor; a first organic film formed in an upper layer with respect to the thin film transistor; a photoelectric conversion element formed in an upper layer with respect to the first organic film; a first inorganic layer formed so as to cover at least a part of the photoelectric conversion element, and to cover the first organic film; and a second organic film formed in an upper layer with respect to the first organic film, wherein the first inorganic layer has a first through hole that connects the first organic film and the second organic film.

A method for manufacturing a photoelectric conversion panel in a second aspect includes: forming a thin film transistor; forming a first organic film in an upper layer with respect to the thin film transistor; forming a photoelectric conversion element in an upper layer with respect to the first organic film; forming a first inorganic layer so that the first inorganic layer covers at least a part of the photoelectric conversion element, and covers the first organic film; and forming a second organic film in an upper layer with respect to the first organic film, wherein the forming of the first inorganic layer includes providing a first through hole in the first inorganic layer so that the through hole connects the first organic film and the second organic film.

With the configurations of the first and second aspects, it is possible to provide such a photoelectric conversion panel that a first inorganic layer can be restrained from separating from a first organic film in the manufacture of the photoelectric conversion panel even in a case where the photoelectric conversion panel includes the first organic film and a second organic film, and to provide a method for manufacturing the photoelectric conversion panel.

BRIEF DESCRIPTION OF DRAWINGS

FIG. 23 is a plan view schematically illustrating a configuration of a part of a photoelectric conversion panel according to a modification example.

DESCRIPTION OF EMBODIMENTS

Figure 1:
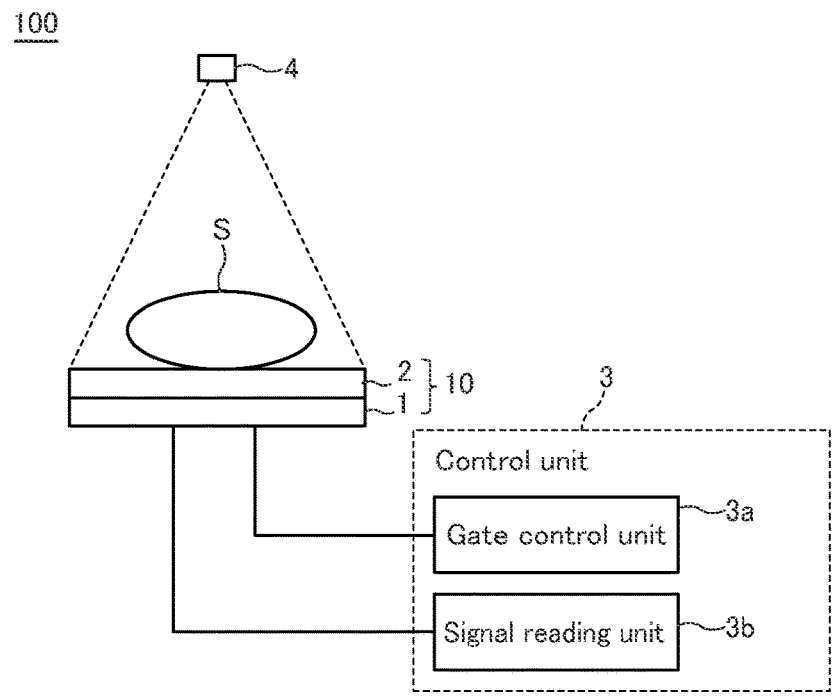
FIG. 1 is a cross-sectional view illustrating a schematic configuration of an X-ray imaging device in Embodiment 1.

The following description describes embodiments of the present disclosure, based on the drawings. It should be noted that the present disclosure is not limited to the embodiments shown below, but the design thereof may be appropriately varied in such a manner that the configuration of the present disclosure is satisfied. In addition, in the following description, parts that are identical or have similar functions denoted by the same reference numerals commonly in different drawings, and the descriptions of the same are not repeated. Constitutional elements described in the embodiments and the modification examples may be appropriately combined or varied without departing from the spirit and scope of the present disclosure. To make the description easy to understand, in the drawings referred to hereinafter, the configurations are simply illustrated or schematically illustrated, or the illustration of part of constituent members is omitted. Further, dimension ratios of constituent members illustrated in the drawings do not necessarily indicate actual dimension ratios.

Embodiment 1

(Configuration)

FIG. 1 is a schematic diagram illustrating an X-ray imaging device 100 in Embodiment 1 equipped with an X-ray imaging panel 10 including a photoelectric conversion panel 1. The X-ray imaging device 100 includes the X-ray imaging panel 10 including the photoelectric conversion panel 1 and a scintillator 2, as well as a control unit 3. The control unit 3 includes a gate control unit 3a and a signal reading unit 3b. X-rays are emitted from an X-ray source 4 and are projected to an object S. The X-rays transmitted through the object S are converted into fluorescence (hereinafter referred to as scintillation light) in a scintillator 2 arranged above the photoelectric conversion panel 1. The scintillation light is picked up by the X-ray imaging panel 10, and thereby the X-ray imaging device 100 acquires an X-ray image from the control unit 3.

Figure 2:
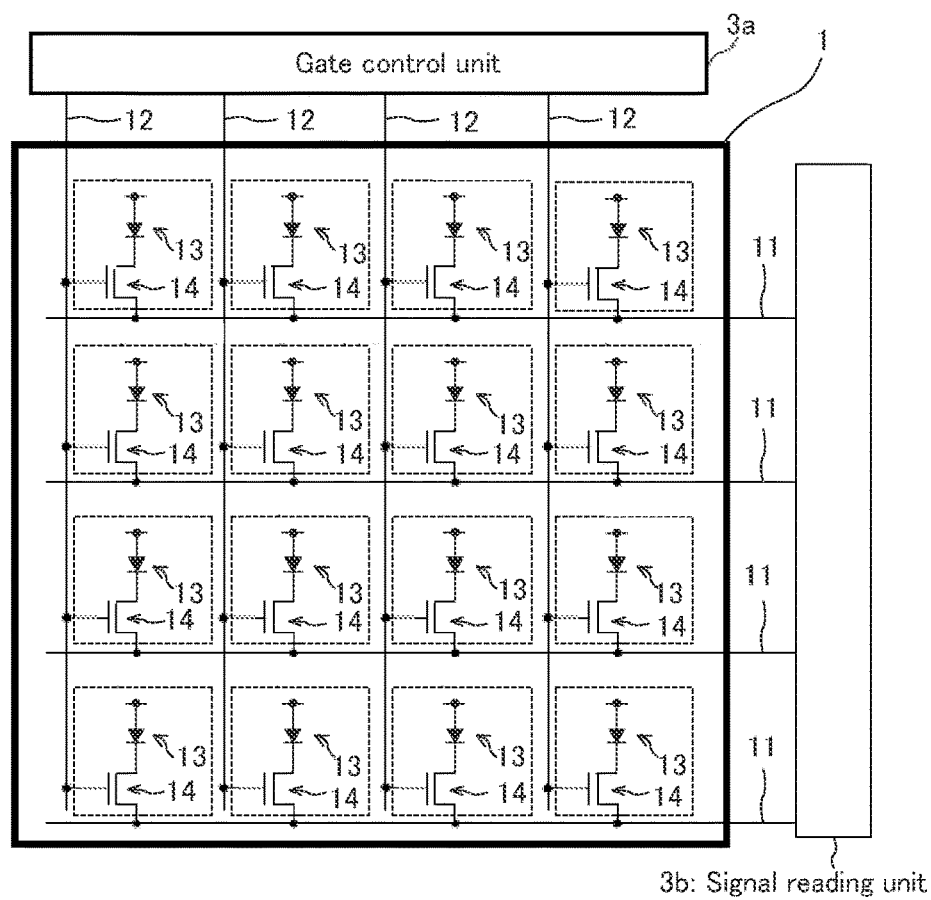
FIG. 2 is a schematic diagram for explaining connection between a photoelectric conversion panel and a control unit.

FIG. 2 is a schematic diagram illustrating a schematic configuration of the photoelectric conversion panel 1. As illustrated in FIG. 2, a plurality of source lines 11 (data lines), and a plurality of gate lines 12 intersecting with the source lines 11 are formed in the photoelectric conversion panel 1. The gate lines 12 are connected with the gate control unit 3a, and the source lines 11 are connected with the signal reading unit 3b.

In the photoelectric conversion panel 1, photodiodes 13 are provided, respectively, in areas (pixels) surrounded by the source lines 11 and the gate lines 12 (hereinafter referred to as pixels). In addition, the photoelectric conversion panel 1 includes thin film transistors (TFTs) 14 connected to the source lines 11 and the gate lines 12, at positions at which the source lines 11 and the gate lines 12 intersect. The photodiode 13 converts scintillation light obtained by converting X-rays transmitted through the object S, into charges according to the amount of the light.

The gate lines 12 in the photoelectric conversion panel 1 are sequentially switched by the gate control unit 3a into a selected state, and the TFT 14 connected to the gate line 12 in the selected state is turned ON. When the TFT 14 is turned ON, a signal according to the charges obtained by the conversion by the photodiode 13 is output through the source line 11 to the signal reading unit 3b.

Figure 3:
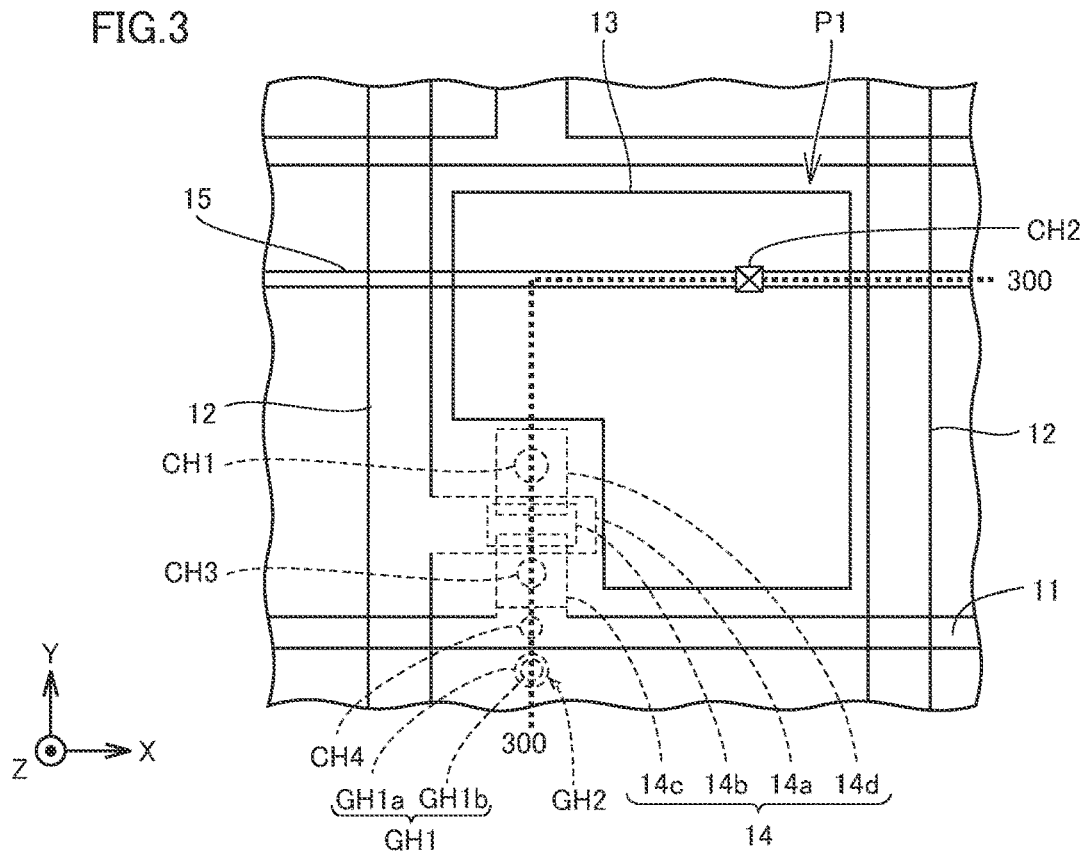
FIG. 3 is a plan view schematically illustrating a configuration of a part of the photoelectric conversion panel.

FIG. 3 is an enlarged plan view of a part of the photoelectric conversion panel 1 illustrated in FIG. 2. As illustrated in FIG. 3, in each area surrounded by the gate lines 12 and the source line 11, the photodiode 13 and the TFT 14 are provided. The photodiode 13 includes a first lower electrode 13a, a second lower electrode 13b, an upper electrode 13c, as well as a photoelectric conversion layer 16. The photoelectric conversion layer 16 is provided between the first lower electrode 13a and the second lower electrode 13b on one hand, and the upper electrode 13c on the other hand. Incidentally, a first through hole GH1 (a first hole portion GH1a and a second hole portion GH1b) and a second through hole GH2, which are described below, are provided between adjacent photodiodes 13 when viewed in a plan view. Further, the first through hole GH1 (and the second through hole GH2) are provided in the vicinity of the TFT 14 (particularly, in the vicinity of a semiconductor active layer 14b in a channel part). Still further, whereas the first through hole GH1 (and the second through hole GH2) are provided in the vicinity of the TFT 14, they are not provided immediately above the TFT 14. This configuration makes it possible to prevent the channel part of the TFT 14 from being damaged indirectly by dry etching when the first through hole GH1 (and the second through hole GH2) are opened. As a result, by forming the first through hole GH1 (and the second through hole GH2), a possibility of affecting the properties of the TFT 14 can be reduced.

The TFT 14 includes a gate electrode 14a provided integrally with the gate line 12, a semiconductor active layer 14b, a source electrode 14c connected to the source line 11, and a drain electrode 14d. The drain electrode 14d and the second lower electrode 13b are connected with each other via the first lower electrode 13a provided in a contact hole CH1. The bias line 15 is partially provided in a contact hole CH2, and supplies a bias voltage to the photodiode 13 through the contact hole H2. The source electrode 14c is connected to the source line 11 via a source connection electrode 11a provided in a contact hole CH3, the source connection electrode 11a being described below.

Figure 4:
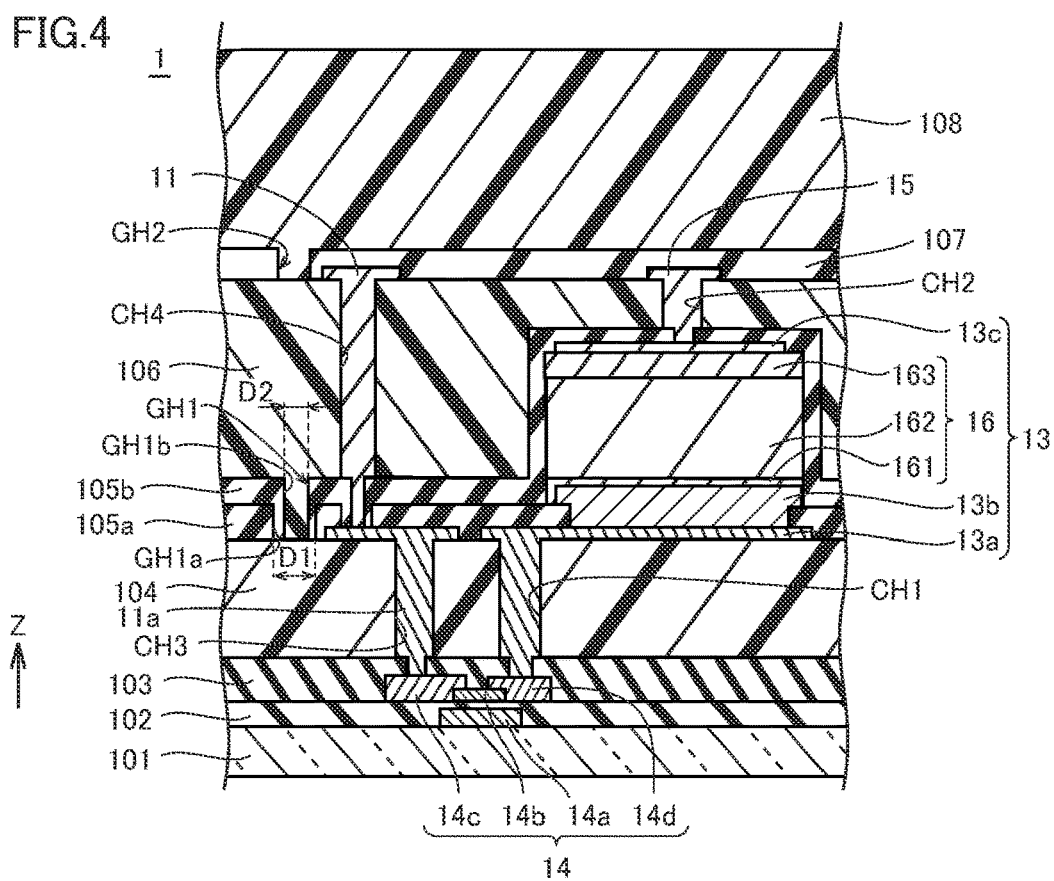
FIG. 4 illustrates a partial cross section taken along the line 300-300 in FIG. 3.

Here, a cross-sectional view taken along line 300-300 in FIG. 3 is illustrated in FIG. 4. Scintillation light converted by the scintillator 2 enters from a side of the photoelectric conversion panel 1, the side being a side in the z-axis positive direction in FIG. 4.

<Configuration of Thin Film Transistor>

As illustrated in FIG. 4, the gate electrode 14a and a gate insulating film 102 are formed on a glass substrate 101. The glass substrate 101 is a substrate having an insulating property. The gate electrode 14a is formed, for example, as a laminated film containing tungsten (W) and tantalum nitride (TaN) as materials.

The gate insulating film 102 covers the gate electrode 14a. The gate insulating film 102 may be formed with, for example, silicon oxide ($SiO_x$), silicon nitride ($SiN_x$), silicon oxide nitride ($SiO_xN_y$)(x>y), or silicon nitride oxide ($SiN_xO_y$)(x>y). In Embodiment 1, the gate insulating film 102 is formed by laminating an insulating film made of silicon oxide ($SiO_x$) in an upper layer and an insulating film made of silicon nitride ($SiN_x$) in a lower layer.

The semiconductor active layer 14b, as well as the source electrode 14c and the drain electrode 14d connected with the semiconductor active layer 14b are provided on the gate electrode 14a with the gate insulating film 102 being interposed therebetween.

The semiconductor active layer 14b is formed in contact with the gate insulating film 102. The semiconductor active layer 14b is made of an oxide semiconductor. In Embodiment 1, the oxide semiconductor contains an IGZO (In—Ga—Zn—O)-based oxide semiconductor. More specifically, as the oxide semiconductor, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); or an amorphous oxide semiconductor containing indium (In), gallium (Ga), and zinc (Zn) at a predetermined ratio. In this configuration, the oxidation by a first organic film 104 described below with respect to the TFT 14, and the reduction by the first inorganic insulating film 105a (silicon nitride) with respect to the TFT 14, are optimized, which enables to restrain the TFT from having current-voltage characteristics (I-V characteristics) of the depletion mode.

The source electrode 14c and the drain electrode 14d are arranged so as to be in contact with a part of the semiconductor active layer 14b on the gate insulating film 102. The drain electrode 14d is connected with the first lower electrode 13a provided in the contact hole CH1. The source electrode 14c is connected with the source connection electrode 11a provided in the contact hole CH3. Additionally, the source electrode 14c and the drain electrode 14d are formed on the same layer. The source electrode 14c and the drain electrode 14d have, for example, a three-layer laminate structure in which a metal film made of aluminum (Al) is interposed between two metal films made of titanium (Ti).

A first insulating film 103 is provided on the gate insulation film 102, so as to overlap with the source electrode 14c and the drain electrode 14d. The first insulating film 103 has a first opening (contact portion) on the drain electrode 14d, and a second opening (contact portion) on the source electrode 14c. In this example, the first insulating film 103 is formed with, for example, an inorganic insulating film (single layer film, laminated film) made of silicon oxide ($SiO_2$) or silicon nitride ($SiN_x$).

<Configuration of First Organic Film>

On the first insulating film 103, the first organic film 104 is provided. In other words, the first organic film 104 is formed in an upper layer with respect to the TFT 14. This makes the first organic film 104 have a function as a flattening film for the TFT 14. The first organic film 104 has the first opening (contact portion) on the drain electrode 14d. The first opening of the first insulating film 103 and the first opening of the first organic film 104 form the contact hole CH1. The first organic film 104 has the second opening (contact portion) on the source electrode 14c. The second opening of the first insulating film 103 and the second opening of the first organic film 104 form the contact hole CH3. The first organic film 104 is made of, for example, an organic transparent resin such as an acrylic resin or a siloxane-based resin. In Embodiment 1, the first organic film 104 is made of a photosensitive acrylic resin.

<Configuration of First Lower Electrode and Source Connection Electrode>

On the first organic film 104, the first lower electrode 13a and the source connection electrode 11a are provided. The first lower electrode 13a is partially formed in the contact hole CH1, thereby connecting the drain electrode 14d and the second lower electrode 13b described below. The source connection electrode 11a is partially formed in the contact hole CH3, thereby connecting the source electrode 14c and the source line 11. Each of the first lower electrode 13a and the source connection electrode 11a has, for example, a three-layer laminate structure in which two metal films made of titanium (Ti) having different thicknesses (100 nm and 50 nm) are laminated so that a metal film made of aluminum (Al) (300 nm) is interposed therebetween. Incidentally, the first lower electrode 13a and the source connection electrode 11a may have a single layer structure made of aluminum. Here, as the first lower electrode 13a and the source connection electrode 11a contain aluminum, which has a relatively smaller resistance value, the first lower electrode 13a and the source connection electrode 11a have relatively smaller resistance values.

<Configuration of First Inorganic Insulating Film>

On the first lower electrode 13a, the first inorganic insulating film 105a is provided so as to partially cover the first lower electrode 13a and the first organic film 104. In the first inorganic insulating film 105a, the first hole portion GH1a is provided that forms at least a part of the first through hole GH1. The first through hole GH1 has a function of releasing, to outside, gas (generated gas) that is generated from the first organic film 104 when the second organic film 106 is formed. The first through hole GH1 has a function of connecting the first organic film 104 and the second organic film 106. This configuration makes it possible to release gas through the first through hole GH1 to the second organic film 106 side, even in a case where heat for forming the second organic film 106 is transmitted to the first organic film 104, thereby causing gas to be generated from the first organic film 104, in the manufacture of the photoelectric conversion panel 1. Gas molecules are released through interstices of a bond network of the organic film. This restrains gas from accumulating between the first inorganic insulating film 105a (as well as a second inorganic insulating film 105b to be described below) and the first organic film 104. As a result, it is possible to restrain the first inorganic insulating film 105a (as well as the second inorganic insulating film 105b) from separating from the first organic film 104 in the manufacture of the photoelectric conversion panel 1, even in a case where the photoelectric conversion panel 1 includes the first organic film 104 and the second organic film 106. In addition, this also prevents gas from accumulating in between the source connection electrode 11a as well as the first lower electrode 13a (photodiode 13), and the first organic film 104. This makes it possible to restrain the source connection electrode 11a from separating from the first organic film 104, and to restrain the photodiode 13 from separating from the first organic film 104.

Further, the first inorganic insulating film 105a functions as a film coating the first lower electrode 13a. This configuration enables to release gas from the first organic film 104 to the second organic film 106 side through the first hole portion GH1a (the first through hole GH1) of the first inorganic insulating film 105a in the manufacture of the photoelectric conversion panel 1, even in a case where the photoelectric conversion panel 1 includes the photodiode 13 having the first lower electrode 13a.

The first inorganic insulating film 105a may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In Embodiment 1, the first inorganic insulating film 105a is formed with silicon oxynitride ($SiN_x$). Further, in the first inorganic insulating film 105a, a first opening (contact portion), in which the second lower electrode 13b is to be provided, is provided on the first lower electrode 13a. Still further, in the first inorganic insulating film 105a, a second opening (contact portion) in which the source line 11 is to be provided is provided on the source connection electrode 11a.

The first inorganic insulating film 105a has a thickness of, for example, 100 nm or more and 500 nm or less. This film thickness makes it possible to restrain the first lower electrode 13a from becoming exposed when the photoelectric conversion layer 16 is etched in the manufacture of the photoelectric conversion panel 1. Incidentally, in Embodiment 1, the first inorganic insulating film 105a has a thickness of, for example, 350 nm.

<Configuration of Second Lower Electrode>

The second lower electrode 13b is provided so as to cover the first opening of the first inorganic insulating film 105a and a part of the first inorganic insulating film 105a. The second lower electrode 13b is formed with titanium (Ti), which has a resistance higher than that of aluminum (Al). The second lower electrode 13b has a thickness of, for example, 10 nm or more and 50 nm or less. This film thickness makes it possible to restrain a part of the second lower electrode 13b from scattering when the photoelectric conversion layer 16 is etched in the manufacture of the photoelectric conversion panel 1. Incidentally, in Embodiment 1, the second lower electrode 13b has a thickness of 30 nm.

<Configuration of Photoelectric Conversion Layer>

On the second lower electrode 13b, the photoelectric conversion layer 16 is provided. The photoelectric conversion layer 16 is composed of an n-type amorphous semiconductor layer 161, an intrinsic amorphous semiconductor layer 162, and a p-type amorphous semiconductor layer 163, which are laminated in the order. The n-type amorphous semiconductor layer 161 is made of amorphous silicon doped with an n-type impurity (for example, phosphorus). The intrinsic amorphous semiconductor layer 162 is made of intrinsic amorphous silicon. The intrinsic amorphous semiconductor layer 162 is formed in contact with the n-type amorphous semiconductor layer 161. The p-type amorphous semiconductor layer 163 is made of amorphous silicon doped with a p-type impurity (for example, boron). The p-type amorphous semiconductor layer 163 is formed in contact with the intrinsic amorphous semiconductor layer 162.

On the photoelectric conversion layer 16, the upper electrode 13c is provided. The upper electrode 13c is made of, for example, indium tin oxide (ITO). In other words, the photodiode 13 is formed in an upper layer with respect to the first organic film 104.

<Configuration of Second Inorganic Insulating Film>

The second inorganic insulating film 105b is provided so as to cover at least a part of the photodiode 13 and the first inorganic insulating film 105a. The second inorganic insulating film 105b covers a part of the top surface of the photodiode 13 and side surfaces of the photodiode 13. This allows the second inorganic insulating film 105b to function as a passivation film and a coating film for the photodiode 13, the first lower electrode 13a, and the source connection electrode 11a.

Here, in Embodiment 1, the second hole portion GH1b, constituting at least a part of the first through hole GH1, is provided in the second inorganic insulating film 105b. The first through hole GH1 is composed of the first hole portion GH1a and the second hole portion GH1b. More specifically, the second inorganic insulating film 105b is formed so as to coat the inner surface of the first hole portion GH1a, thereby forming the second hole portion GH1b, and in this way, the first through hole GH1 is formed. this configuration enables to release gas from the first organic film 104 to the second organic film 106 side through the first through hole GH1 in the manufacture of the photoelectric conversion panel 1, even in a case where the second inorganic insulating film 105b covering at least a part of the first inorganic insulating film 105a is provided in the photoelectric conversion panel 1. Other than the above-described configuration in which the first hole portion GH1a and the second hole portion GH1b are separately formed, the following configuration is also possible: the first hole portion GH1a is not formed, and a hole going through the second inorganic insulating film 105b to reach the first organic film 104 is formed when the second hole portion GH1b is formed (for example, in Embodiment 2). This makes it possible to reduce the area of the whole contact hole.

Further, the second hole portion GH1b is provided at a position overlapping with the first hole portion GH1a when viewed in a plan view (see FIG. 3). This configuration allows the first hole portion GH1a and the second hole portion GH1b to be easily connected, thereby making it possible to form the first through hole GH1 in the photoelectric conversion panel 1 easily. Further, the second hole portion GH1b is provided at a position not overlapping with the photodiode 13 when viewed in a plan view. This configuration allows the first organic film 104 and the second organic film 106 to be easily connected, even in a case where the photodiode 13 is provided in the photoelectric conversion panel 1. As a result, it is possible to easily release gas from the first organic film 104 to the second organic film 106 side in the manufacture of the photoelectric conversion panel 1.

In addition, the second inorganic insulating film 105b is formed so as to coat the inner surface of the first hole portion GH1a. Accordingly, the diameter D1 of the second hole portion GH1b is smaller than the diameter D2 of the first hole portion GH1a. In this example, the second inorganic insulating film 105b is formed with, for example, an inorganic insulating film made of silicon nitride ($SiN_x$).

Still further, in the second inorganic insulating film 105b, a first opening (contact) is provided on the upper electrode 13b, and a second opening (contact) is provided on the source connection electrode 11a.

<Configuration of Second Organic Film>

The second organic film 106 is provided, which is formed in an upper layer with respect to the first organic film 104, covers at least a part of the second inorganic insulating film 105b, and is partially filled in the second hole portion GH1b. The second organic film 106 has a function as a flattening film for flattening step parts formed by the photodiode 13. Besides, the second organic film 106 is in contact with the first organic film 104, for example, at the second hole portion GH1b (the first through hole GH1). The second organic film 106 is made of, for example, the same material as that of the first organic film 104. The second organic film 106 is made of, for example, an organic transparent resin such as an acrylic resin or a siloxane-based resin. In Embodiment 1, the second organic film 106 is made of a photosensitive acrylic resin. With this configuration, the first organic film 104 and the second organic film 106, which are made of the same material, are connected with each other in the first through hole GH1, which enables the first organic film 104 and the second organic film 106 to easily expand and contract in the vertical direction (make them flexible).

Further, in the second organic film 106, there are provided a first opening that forms the contact hole CH2 together with the first opening of the second inorganic insulating film 105b, and a second opening that forms the contact hole CH4 together with the second opening of the second inorganic insulating film 105b.

<Configuration of Bias Line and Source Line>

On the second organic film 106, the bias line 15 and the source line 11 are provided. The bias line 15 is in contact with the upper electrode 13c at the contact hole CH2. The source line 11 is in contact with the source connection electrode 11a at the contact hole CH2.

The bias line 15 is connected to the control unit 3 (see FIG. 1). The bias line 15 applies a bias voltage through the contact hole CH2 to the upper electrode 13c, the bias voltage being input from the control unit 3. The source line 11 is connected to the control unit 3 (see FIG. 1). The source line 11 goes through the contact hole CH4, and when the TFT 14 is turned ON, a signal according to the charges obtained by the conversion by the photodiode 13 is output through the source line 11 to the signal reading unit 3b. The source line 11 and the bias line 15, for example, are formed with ITO, or have a structure in which a metal film made of aluminum (Al) is interposed between two meal films made of titanium (Ti).

<Configuration of Third Inorganic Insulating Film>

On the second organic film 106, the third inorganic insulating film 107 is provided so as to cover the source line 11 and the bias line 15. The third inorganic insulating film 107 is made of, for example, silicon nitride (SiN). The third inorganic insulating film 107 is formed so as to cover the second organic film 106, and the second through hole GH2 is provided, which connects the second organic film 106 and a third organic film 108 described below. Further, the third inorganic insulating film 107 functions as a passivation film. The second through hole GH2 has a function of releasing gas (generated gas) from the second organic film 106, in a step of forming the third organic film 108 in the manufacture of the photoelectric conversion panel 1. This configuration enables to release gas generated from the second organic film 106 to the third organic film 108 side through the second through hole GH2 in the manufacture of the photoelectric conversion panel 1, even in a case where the third organic film 108 is provided in the photoelectric conversion panel 1.

Besides, in Embodiment 1, the second through hole GH2 is provided at a position overlapping with the first through hole GH1 when viewed in a plan view. This configuration makes it possible to form the second through hole GH2 easily, as compared with a case where the second through hole GH2 is formed at a position different from that of the first through hole GH1 when viewed in a plan view. In addition, as the distance between GH1 and GH2 is shortest, gas can be released through the shortest route.

<Configuration of Third Organic Film>

The third organic film 108 is provided so as to cover the third inorganic insulating film 107. The third organic film 108 is formed in an upper layer with respect to the second organic film 106, covers the third inorganic insulating film 107, and is partially filled in the second through hole GH2. The third organic film 108 has a function as a protective film for protecting the third inorganic insulating film 107 and the like. Besides, the third organic film 108 is in contact with the second organic film 106, for example, at the second through hole GH2b. The third organic film 108 is made of, for example, the same material as that of the second organic film 106. The third organic film 108 is made of an organic transparent resin such as an acrylic resin or a siloxane-based resin. In Embodiment 1, the third organic film 108 is made of a photosensitive acrylic resin.

(Method for Manufacturing Photoelectric Conversion Panel)

Figure 5:
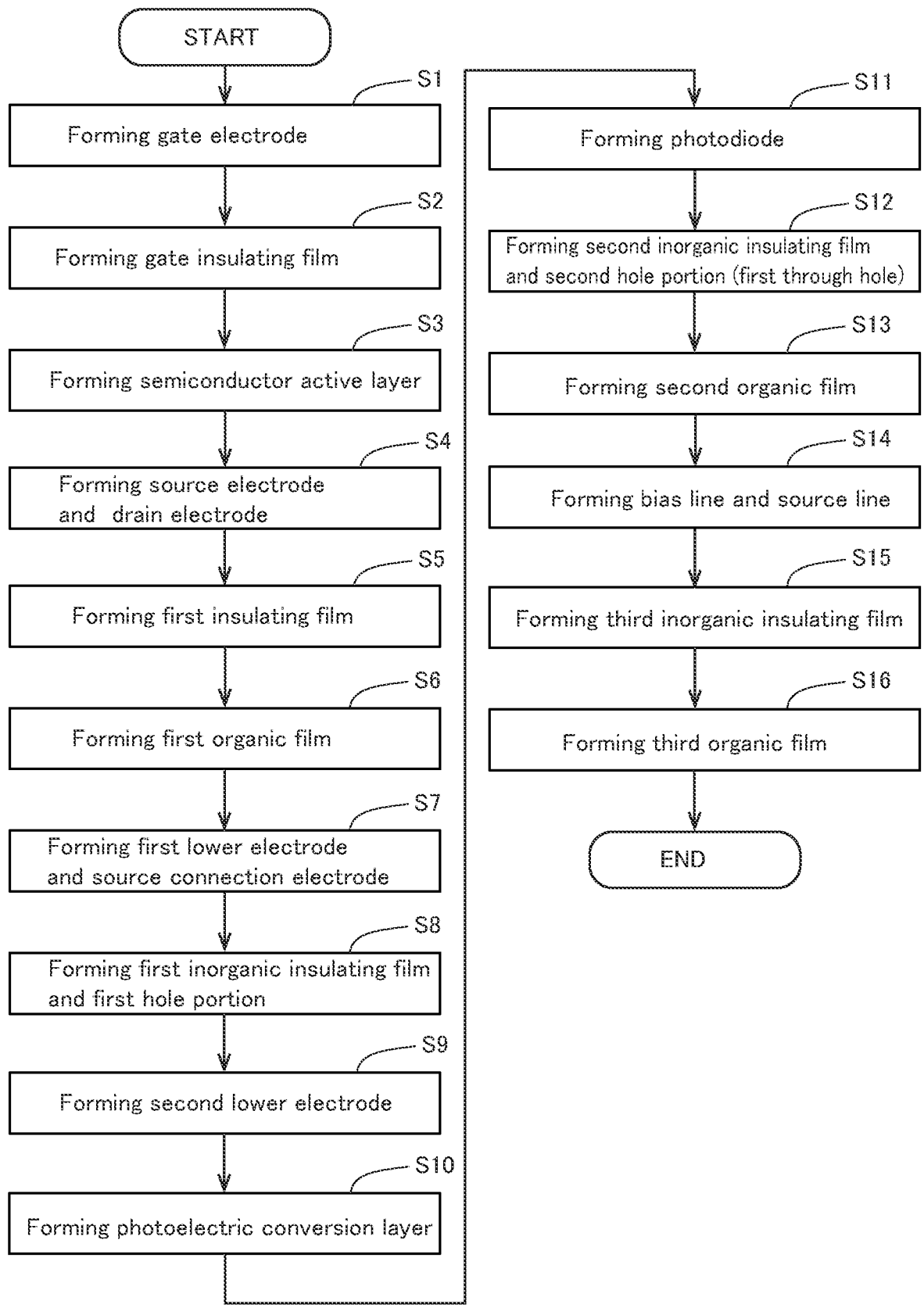
FIG. 5 is a flowchart for explaining a process for manufacturing a photoelectric conversion panel in Embodiment 1.

The following description describes a method for manufacturing the photoelectric conversion panel 1 while referring to FIGS. 5 to 20. FIG. 5 is a flowchart for explaining a process for manufacturing a photoelectric conversion panel 1. FIGS. 6 to 20 are cross-sectional views illustrating respective steps in the process for manufacturing the photoelectric conversion panel 1 (cross sections taken along line 300-300 in FIG. 3)

Figure 6:
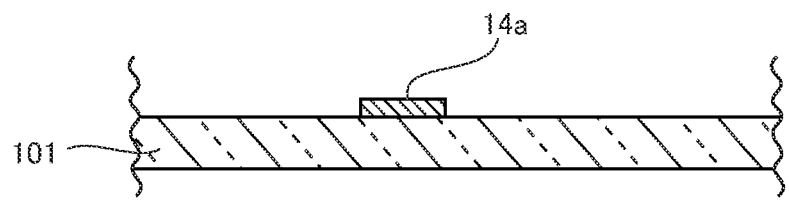
FIG. 6 is a diagram for explaining a step of forming a gate electrode.

As illustrated in FIG. 6, the gate electrode 14a is formed on the glass substrate 101 at Step S1. More specifically, a laminated film made of tungsten (W) and tantalum nitride (TaN) is formed on the glass substrate 101 by, for example, sputtering. Then, photolithography and dry etching are performed, whereby the gate electrode 14a is formed.

Figure 7:
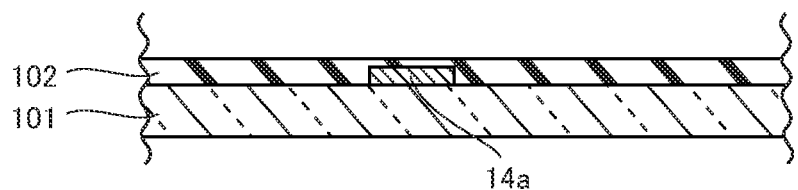
FIG. 7 is a diagram for explaining a step of forming a gate insulating film.

As illustrated in FIG. 7, the gate insulating film 102 is formed at Step S2 so as to cover the gate electrode 14a. For example, a laminated film of silicon oxide ($SiO_x$) and silicon nitride ($SiN_x$) is formed by CVD, whereby the gate insulating film 102 is formed.

Figure 8:
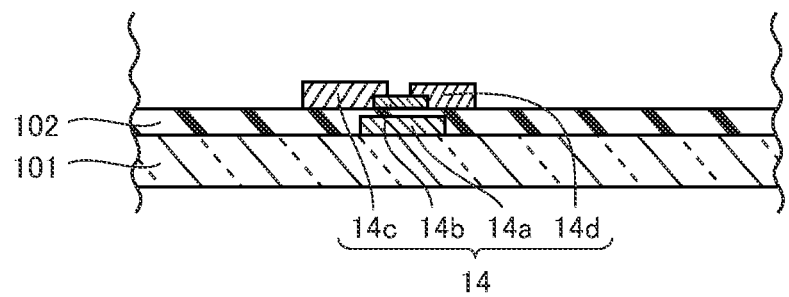
FIG. 8 is a diagram for explaining a step of forming a semiconductor active layer, a source electrode, and a drain electrode.

As illustrated in FIG. 8, the semiconductor active layer 14b is formed on the gate electrode 14a, with the gate insulating film 102 being interposed therebetween, at Step S3. For example, IGZO (In—Ga—Zn—O)-based oxide semiconductor is formed by sputtering, and photolithography and dry etching are performed, whereby the semiconductor active layer 14b is formed. Though not illustrated, a gate contact is formed by photolithography and dry etching performed in this step.

Further, at Step S4, the source electrode 14c and the drain electrode 14d are formed. For example, a laminated film in which a metal film made of aluminum (Al) is interposed between two metal films made of titanium (Ti) is formed by sputtering. Then, photolithography and dry etching are performed, whereby the source electrode 14c and the drain electrode 14d are formed.

Figure 9:
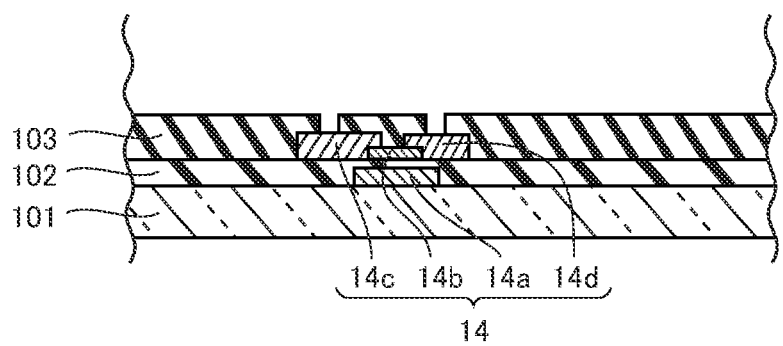
FIG. 9 is a diagram for explaining a step of forming a first insulating film.

As illustrated in FIG. 9, the first insulating film 103 is formed at Step S5 on the gate insulating film 102 so as to overlap with the source electrode 14c and the drain electrode 14*d*. For example, an inorganic insulating film (single layer film) made of silicon oxide ($SiO_2$) is formed by CVD, and photolithography and dry etching are performed, whereby the first insulating film 103 is formed. At this step, in the first insulating film 103, the first opening and the second opening are also formed on the drain electrode 14*d* and the source electrode 14*c*, respectively.

Figure 10:
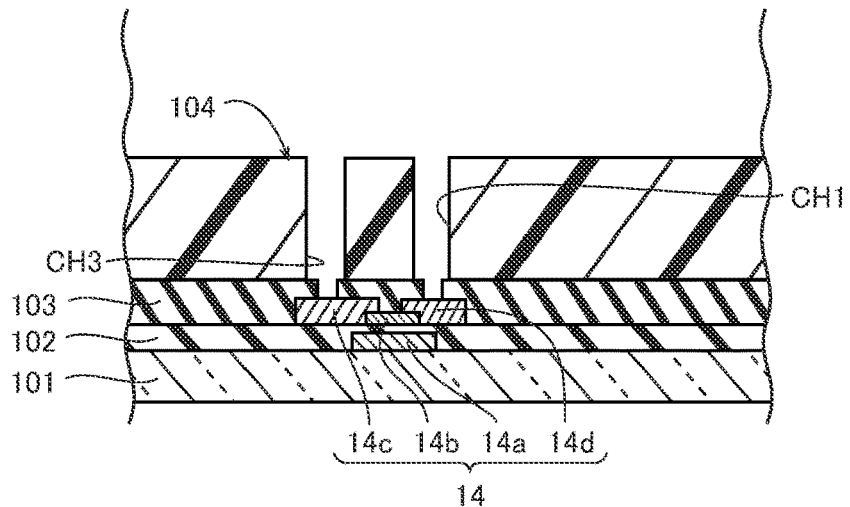
FIG. 10 is a diagram for explaining a step of forming a first organic film.

As illustrated in FIG. 10, the first organic film 104 is formed at Step S6 on the first insulating film 103 (in an upper layer with respect to the TFT 14). For example, the first organic film 104 is formed by applying a photosensitive acrylic resin over the first insulating film 103. In addition, at this step, baking (a step of heating to, for example, 200° C.) is carried out. Then, photolithography and dry etching are performed, whereby the first opening (contact hole CH1) is formed on the drain electrode 14*d* of the first organic film 104, and the second opening (contact hole cH3) is formed on the source electrode 14*c* of the first organic film 104.

Figure 11:
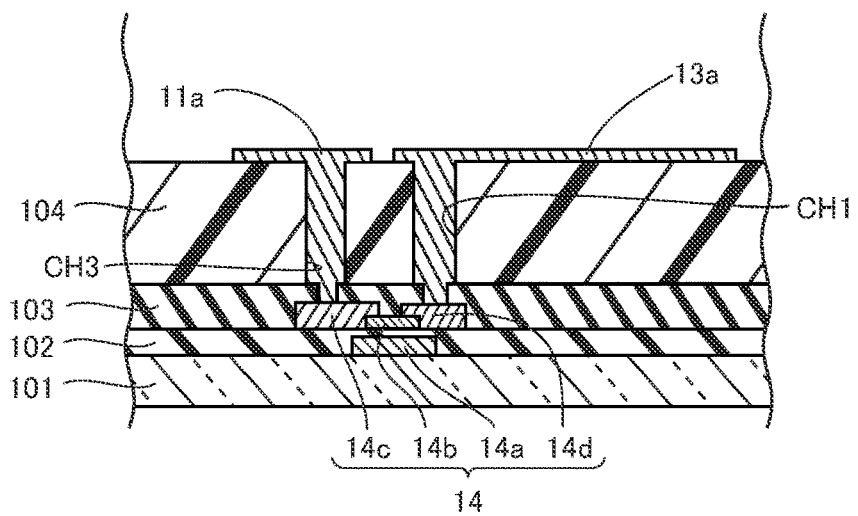
FIG. 11 is a diagram for explaining a step of forming a first lower electrode and a source connection electrode.

As illustrated in FIG. 11, at Step S7, the first lower electrode 13*a* and the source connection electrode 11*a* are formed on the first organic film 104. For example, either a single layer film of aluminum (Al), or a laminated film in which a metal film made of aluminum (Al) is interposed between two metal films made of titanium (Ti), is formed by sputtering. Then, photolithography and dry etching are performed, whereby the first lower electrode 13*a* and the source connection electrode 11*a* are formed.

Figure 12:
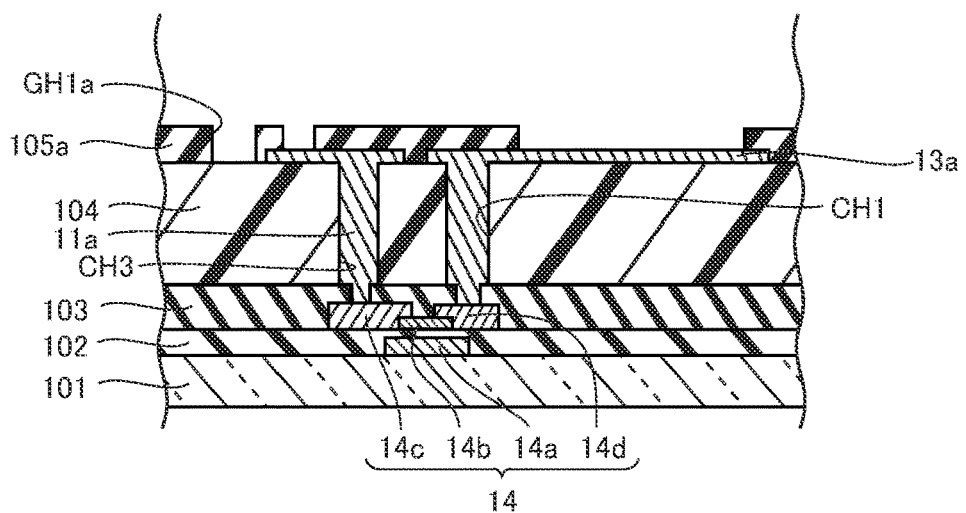
FIG. 12 is a diagram for explaining a step of forming a first inorganic insulating film.

As illustrated in FIG. 12, at Step S8, the first inorganic insulating film 105*a* partially covering the first lower electrode 13*a* and the first organic film 104 is formed on the first lower electrode 13*a*. For example, an inorganic insulating film (single layer film) made of silicon nitride ($SiN_x$) is formed by CVD, and photolithography and dry etching are performed, whereby the first inorganic insulating film 105*a* is formed. Incidentally, the first inorganic insulating film 105*a* may be formed, not with silicon nitride ($SiN_x$), but with silicon oxide ($SiO_2$). In addition, at this step, the first hole portion GH1*a* forming at least a part of the first through hole GH1 is formed in the first inorganic insulating film 105*a*. Further, at this step, in the first inorganic insulating film 105*a*, the first opening in which the second lower electrode 13*b* is provided is formed on the first lower electrode 13*a*. Still further, in the first inorganic insulating film 105*a*, a second opening in which the source line 11 is provided is formed on the source connection electrode 11*a*. The first inorganic insulating film 105*a* is formed so as to have a thickness of, for example, 100 nm or more and 500 nm or less. This film thickness makes it possible to restrain the first lower electrode 13*a* from becoming exposed when the photoelectric conversion layer 16 is etched (Step S11).

Figure 13:
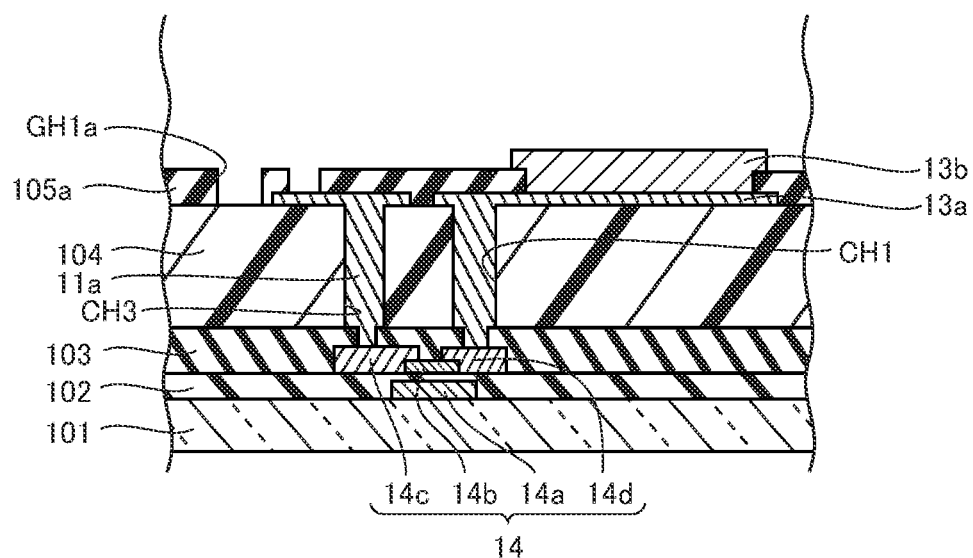
FIG. 13 is a diagram for explaining a step of forming a second lower electrode.

As illustrated in FIG. 13, at Step S9, the second lower electrode 13*b* is formed so as to cover the first opening of the first inorganic insulating film 105*a* and a part of the first inorganic insulating film 105*a*. For example, a metal film made of titanium (Ti) is formed by sputtering, and photolithography and dry etching are performed, whereby the second lower electrode 13*b* is formed. Here, surrounding parts other than the part that becomes the photoelectric conversion layer 16 are removed before the step of forming the photoelectric conversion layer 16 (Step S11). This makes it possible to restrain materials facing the side surface (side wall) of the photoelectric conversion layer 16 from scattering at the step of forming the photoelectric conversion layer 16. The second lower electrode 13*b* having a thickness of, for example, 10 nm or more and 50 nm or less, is formed. This film thickness makes it possible to restrain a part of the second lower electrode 13*b* from scattering when the photoelectric conversion layer 16 is etched. Incidentally, in Embodiment 1, the second lower electrode 13*b* has a thickness of 30 nm.

Figure 14:
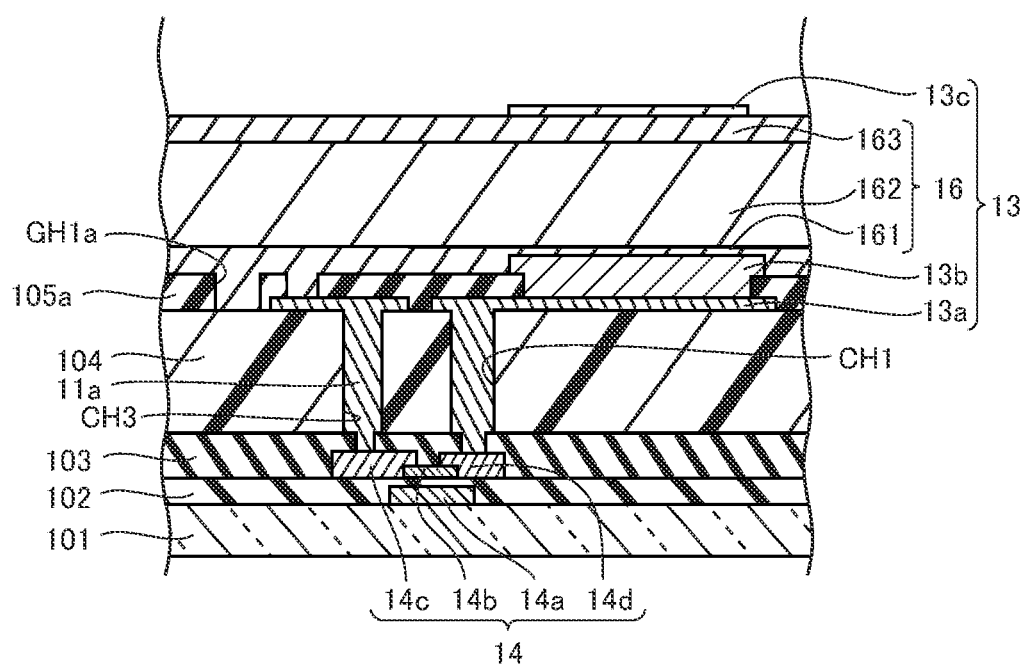
FIG. 14 is a diagram for explaining a step of forming a photoelectric conversion layer.

As illustrated in FIG. 14, at Step S10, the photoelectric conversion layer 16 is formed on the second lower electrode 13*b*. For example, the n-type amorphous semiconductor layer 161 made of amorphous silicon doped with an n-type impurity (for example, phosphorus), the intrinsic amorphous semiconductor layer 162 made of intrinsic amorphous semiconductor, and the p-type amorphous semiconductor layer 163 made of amorphous silicon doped with a p-type impurity (for example, boron), are laminated in this order by CVD.

Then, on the photoelectric conversion layer 16, the upper electrode 13*c* is formed. For example, a film of ITO is formed by sputtering. Then, photolithography and dry etching are performed, whereby the upper electrode 13*c* is formed. Incidentally, after the upper electrode 13*c* is formed, it may be treated with hydrogen plasma or the like, so that damage caused by etching of side walls of the photoelectric conversion layer 16 should be repaired. In this case, after the film of ITO is formed, a passivation film for covering the film of ITO until the etching step may be formed.

Figure 15:
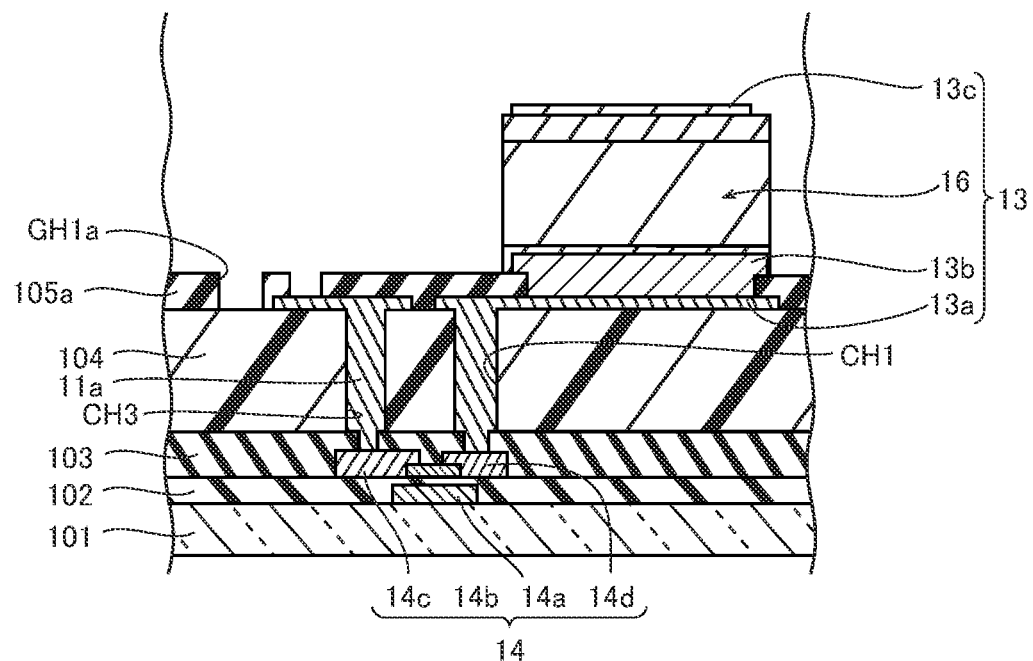
FIG. 15 is a diagram for explaining a step of forming a photodiode.

As illustrated in FIG. 15, photolithography and dry etching are performed at Step S11, whereby the photoelectric conversion layer 16 is formed, and the photodiode 13 is formed.

Figure 16:
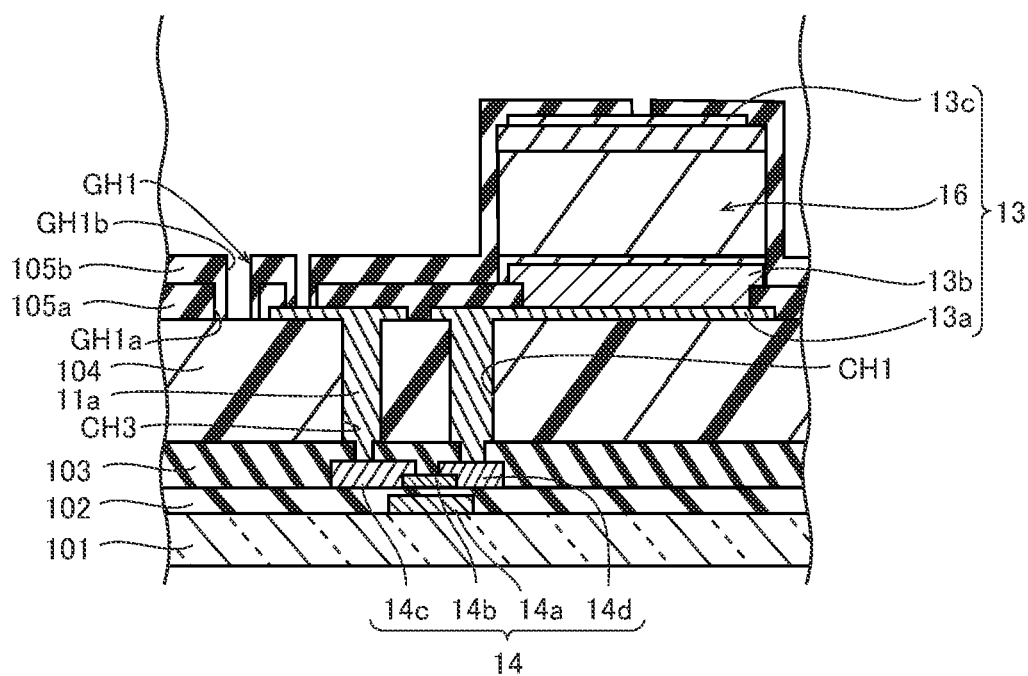
FIG. 16 is a diagram for explaining a step of forming a second inorganic insulating film.

As illustrated in FIG. 16, at Step S12, the second inorganic insulating film 105*b* is formed so as to cover at least a part of the photodiode 13 and the first inorganic insulating film 105*a*. For example, an inorganic insulating film made of silicon nitride ($SiN_x$) is formed by CVD, and photolithography and dry etching are performed, whereby the second inorganic insulating film 105*b* is formed. In addition, at this step, the second hole portion GH1*b* forming at least a part of the first through hole GH1 is formed in the second inorganic insulating film 105*b*. Still further, at this step, in the second inorganic insulating film 105*b*, the first opening (contact) is formed on the upper electrode 13*c*, and the second opening (contact) is formed on the source connection electrode 11*a*.

Figure 17:
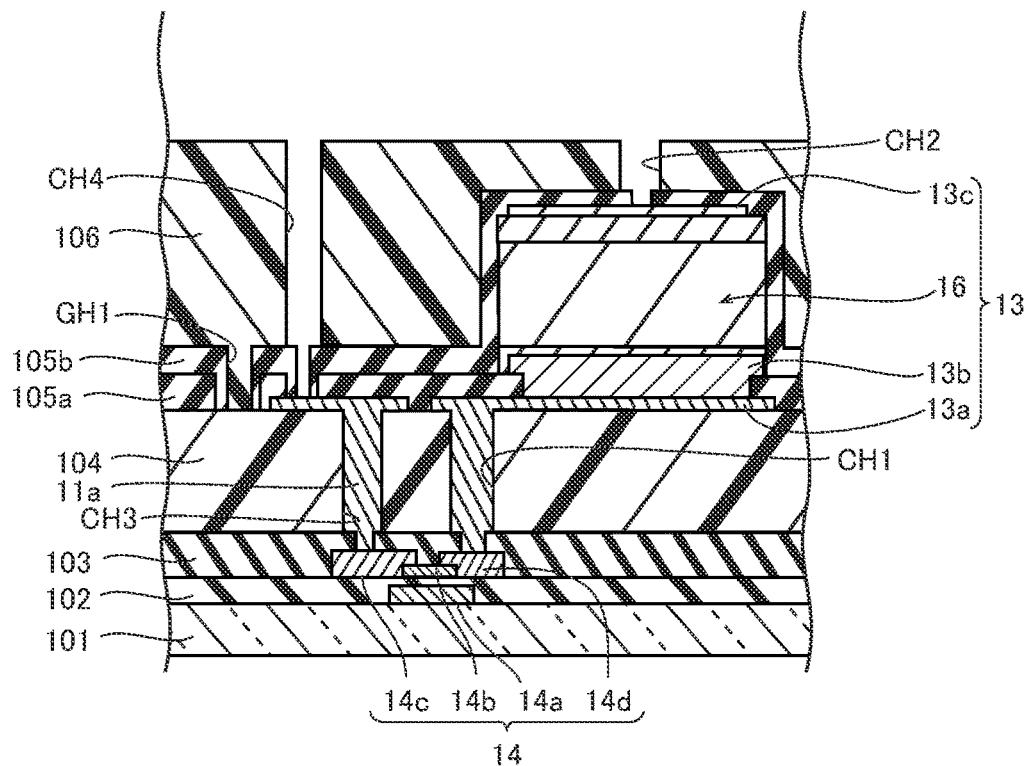
FIG. 17 is a diagram for explaining a step of forming a second organic film.

As illustrated in FIG. 17, at Step S13, the second organic film 106 is formed in an upper layer with respect to the first organic film 104, so as to cover at least a part of the second inorganic insulating film 105*b*, and to be partially filled in the second hole portion GH1*b*. For example, by applying a photosensitive acrylic resin over the second inorganic insulating film 105*b*, the second organic film 106 is formed. In addition, at this step, baking (a step of heating to, for example, 200° C.) of the second organic film 106 or the photosensitive acrylic resin is carried out. Here, heat transmitted also to the first organic film 104 causes gas to be generated in some cases. However, even in a case where gas is generated from the first organic film 104 due to heat, the gas can be released through the first through hole GH1 to the second organic film 106 side. It is considered that gas molecules are released through interstices of a bond network of the organic film. This prevents gas from accumulating between the first inorganic insulating film 105*a* (as well as a second inorganic insulating film 105*b* to be described below) and the first organic film 104. As a result, it is possible to restrain the first inorganic insulating film 105*a* (as well as the second inorganic insulating film 105*b*) from separating from the first organic film 104. In addition, this also prevents gas from accumulating in between the source connection electrode 11*a* as well as the first lower electrode 13*a* (photodiode 13), and the first organic film 104. This makes it possible to restrain the source connection electrode 11a from separating from the first organic film 104, and to restrain the photodiode 13 from separating from the first organic film 104. Then, with photolithography and dry etching performed, the first opening that forms the contact hole CH2 together with the first opening of the second inorganic insulating film 105b, and the second opening that forms the contact hole CH4 together with the second opening of the second inorganic insulating film 105b, are formed in the second organic film 106.

Figure 18:
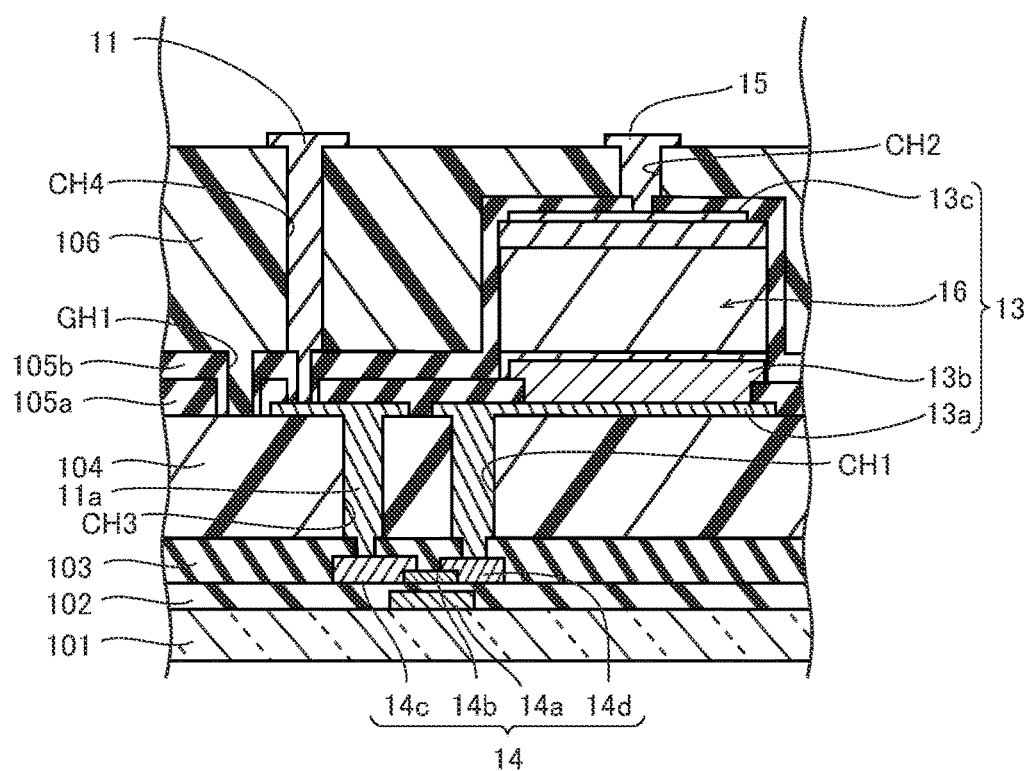
FIG. 18 is a diagram for explaining a step of forming a bias line and a source line.

As illustrated in FIG. 18, at Step S14, the bias line 15 and the source line 11 are formed on the second organic film 106. For example, an ITO film, as well as a film made of titanium (Ti), aluminum (Al), and titanium (Ti), are formed by sputtering, and wet etching as well as dry etching are performed, whereby the bias line 15 and the source line 11 are formed.

Figure 19:
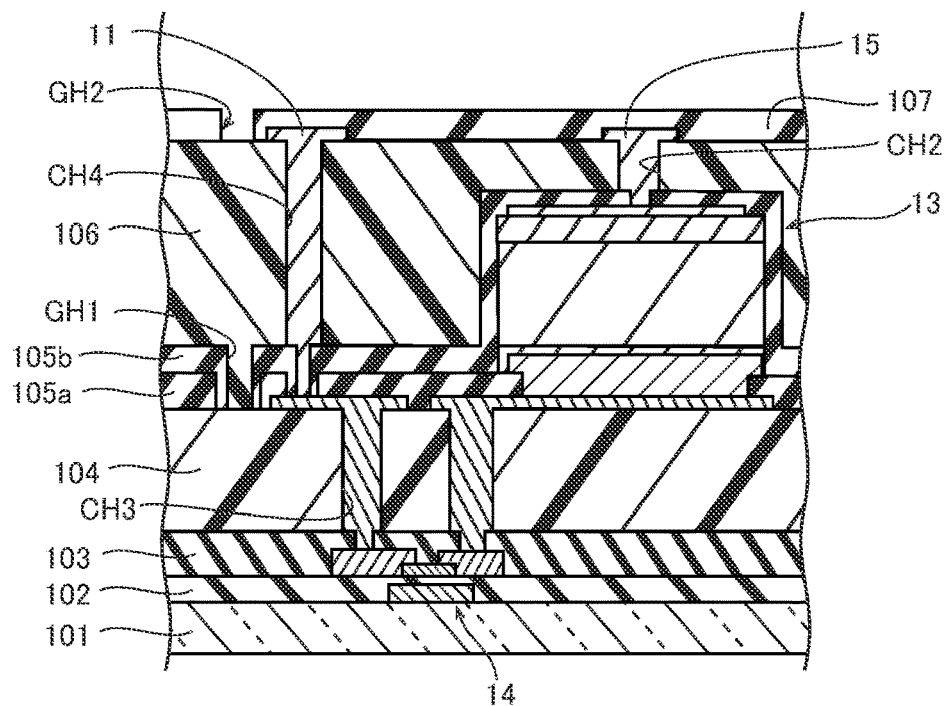
FIG. 19 is a diagram for explaining a step of forming a third inorganic insulating film.

As illustrated in FIG. 19, at Step S15, the third inorganic insulating film 107 is formed so as to cover the source line 11 and the bias line 15 on the second organic film 106. For example, an inorganic insulating film made of silicon nitride ($SiN_x$) is formed by CVD, and photolithography and dry etching are performed, whereby the third inorganic insulating film 107 is formed. In addition, at this step, the second through hole GH2 connecting the second organic film 106 and the third organic film 108 is formed in the third inorganic insulating film 107.

Figure 20:
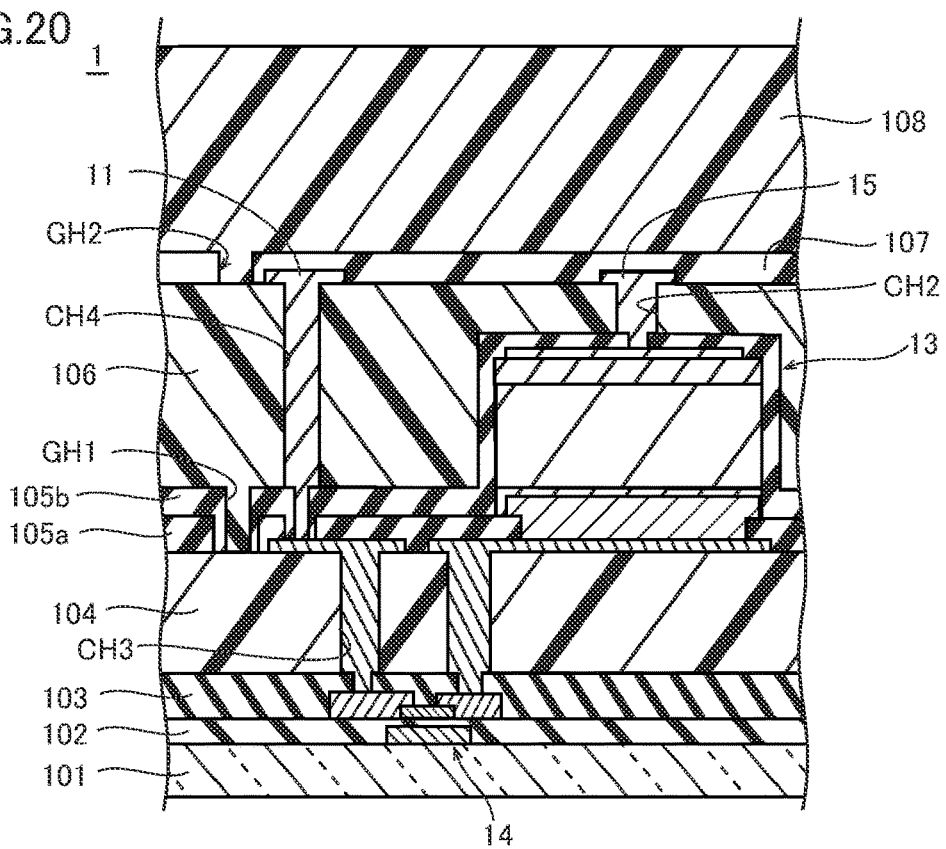
FIG. 20 is a diagram for explaining a step of forming a third organic film.

As illustrated in FIG. 20, at Step S16, the third organic film 108 is formed so as to cover the third inorganic insulating film 107. The third organic film 108 is formed in an upper layer with respect to the second organic film 106, covers the third inorganic insulating film 107, and is partially filled in the second through hole GH2. For example, by applying a photosensitive acrylic resin over the second inorganic insulating film 105b, the second organic film 106 is formed. In addition, at this step, baking (a step of heating to, for example, 200° C.) is carried out. Here, gas generated from the second organic film 106 is released through the second through hole GH2 and the third organic film 108 to outside.

Embodiment 2

Figure 21:
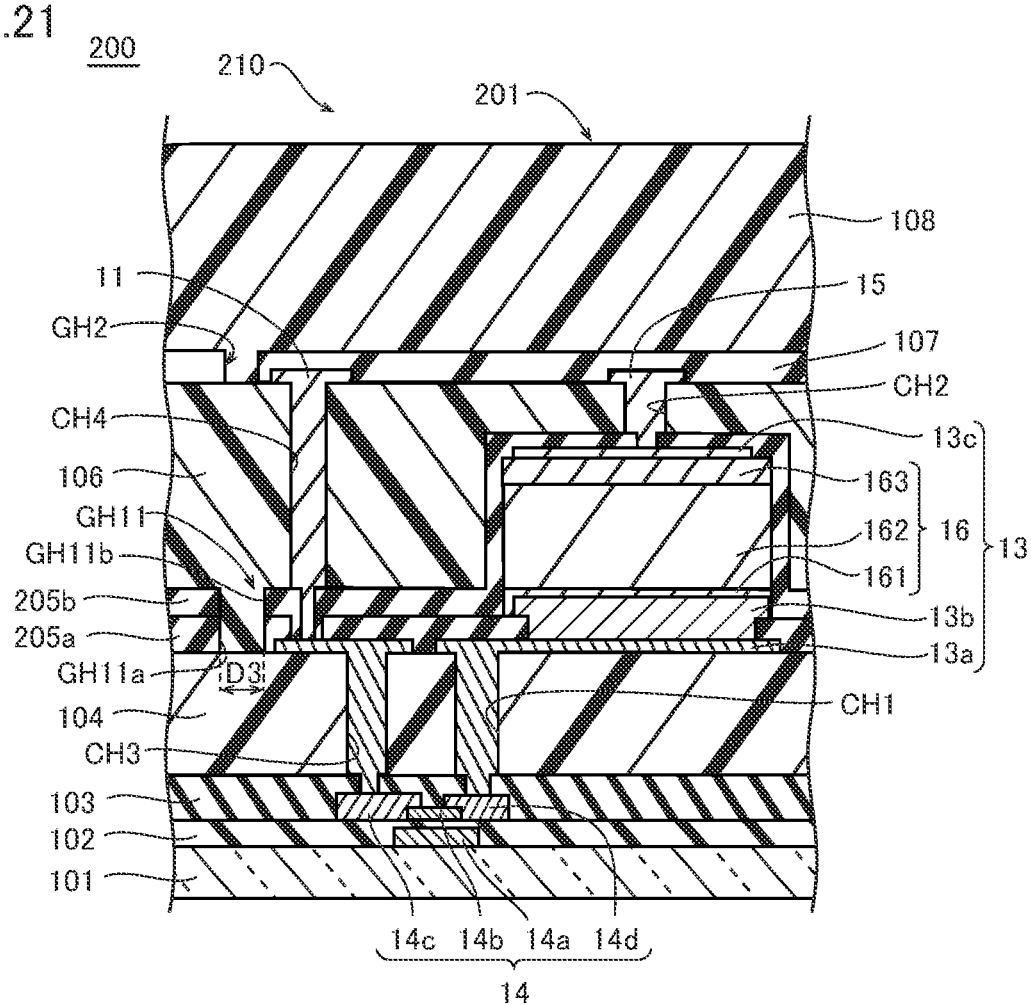
FIG. 21 illustrates an X-ray imaging device (an X-ray imaging panel and a photoelectric conversion panel) of Embodiment 2.

FIG. 21 illustrates a configuration of an X-ray imaging device 200 in Embodiment 2. In Embodiment 2, a first hole portion GH11a and a second hole portion GH11b are formed collectively at one step (S112), unlike Embodiment 1 in which the first hole portion GH1a and the second hole portion GH1b are formed at different steps (S8 and S12), respectively. Incidentally, the same constituent members and steps in manufacture as those in Embodiment 1 are denoted by the same reference symbols as those in Embodiment 1, and descriptions of the same are omitted.

(Configuration)

The X-ray imaging device 200 includes an imaging panel 210 including a photoelectric conversion panel 201, as illustrated in FIG. 21. In the photoelectric conversion panel 201, a first inorganic insulating film 205a and a second inorganic insulating film 205b are provided in place of the first inorganic insulating film 105a and the second inorganic insulating film 105b of the photoelectric conversion panel 1 of Embodiment 1, respectively. Here, in Embodiment 2, the second hole portion GH11b having a diameter D3 equal to a diameter D3 of the first hole portion GH11a of the first inorganic insulating film 205a is provided in the second inorganic insulating film 205b. This configuration enables to collectively etching the first inorganic insulating film 205a and the second inorganic insulating film 205b in the manufacture of the photoelectric conversion panel 201, thereby making it possible to collectively form the first hole portion GH11a and the second hole portion GH11b. As a result, it is possible to restrain the process of manufacturing the photoelectric conversion panel 201 from becoming complicated. Incidentally, the other parts of the configuration of Embodiment 2 are identical to those of Embodiment 1.

(Method for Manufacturing Substrate)

Figure 22:
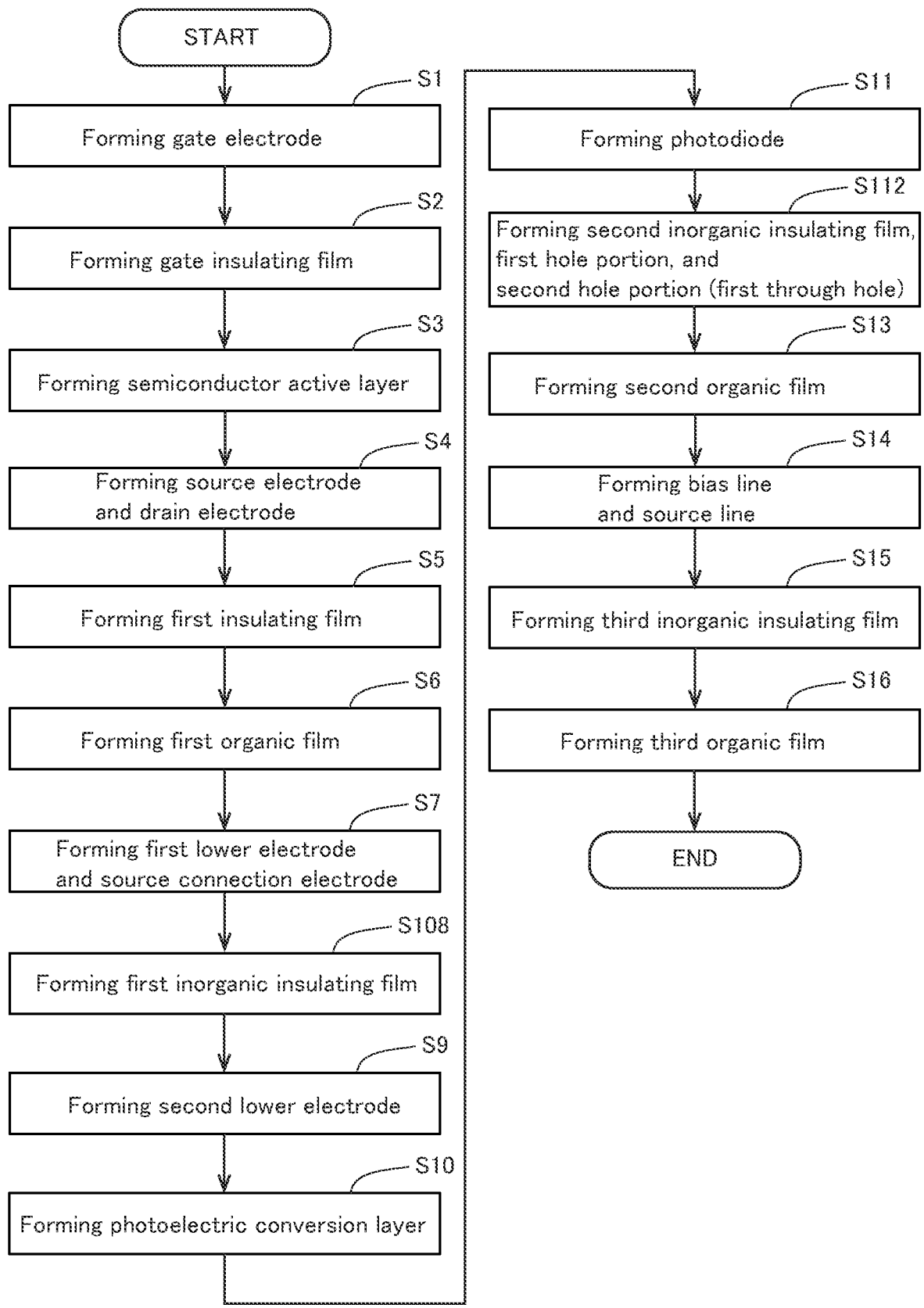
FIG. 22 is a flowchart for explaining a process for manufacturing a photoelectric conversion panel in Embodiment 2.

FIG. 22 is a flowchart for explaining a process for manufacturing a photoelectric conversion panel 201 according to Embodiment 2.

After Steps S1 to S7 are carried out, the first inorganic insulating film 205a is formed at Step S108. In Embodiment 2, the first hole portion GH11a is not formed at this step. Then, after Steps S9 to S11 are carried out, the second inorganic insulating film 205b is formed at Step S112. At this step, photolithography and dry etching are performed, whereby the first hole portion GH11a is formed in the first inorganic insulating film 205a, and the second hole portion GH11b is formed in the second inorganic insulating film 205b, collectively. As a result, the first through hole GH11 is formed. Incidentally, the other parts of the manufacturing method of Embodiment 2 are identical to those of the manufacturing method of Embodiment 1.

The embodiments are thus described above, but the above-described embodiments are merely examples for implementing the present disclosure. The present disclosure, therefore, is not limited to the above-described embodiments, and the above-described embodiments can be appropriately varied and implemented without departing from the spirit and scope of the disclosure.

(1) Embodiments 1 and 2 are described above with reference to an example in which a photoelectric conversion panel is applied to an X-ray imaging panel for an X-ray imaging device, but they are not limited to this example. Alternatively, the above-described photoelectric conversion panel may be applied to an optical sensor panel other than an X-ray sensor panel.

(2) Embodiments 1 and 2 are described above with reference to exemplary thicknesses, materials, and forming methods of the layers (films) composing the photoelectric conversion panel, but they are not limited to this example. Alternatively, the layers (films) composing the photoelectric conversion panel may be formed with other thicknesses, other materials, and other forming methods other than those exemplary ones described above. For example, the first, second, and third organic films may be made of different organic materials, respectively. Further, the first, second, and third inorganic insulating films may be made of different inorganic materials, respectively. The TFTs may be formed with a material other than IGZO.

(3) Embodiments 1 and 2 are described above with reference to an example in which the first inorganic insulating film and the second inorganic insulating film are provided in the photoelectric conversion panel, but the configuration is not limited to this example. Alternatively, only either the first inorganic insulating film or the second inorganic insulating film may be provided in the photoelectric conversion panel; or an inorganic insulating film for forming a first through hole may be further provided in the photoelectric conversion panel, in addition to the first inorganic insulating film and the second inorganic insulating film.

(4) Embodiments 1 and 2 are described above with reference to an example in which the first inorganic insulating film covers the first lower electrode, but the configuration is not limited to this example. Alternatively, the first inorganic insulating film may be formed at such a position that it does not cover the first lower electrode.

(5) Embodiments 1 and 2 are described above with reference to an example in which the first lower electrode and the second lower electrode are provided in the photodiode, but the configuration is not limited to this example. Alternatively, a single lower electrode may be provided in the photodiode.

(6) Embodiments 1 and 2 are described above with reference to an example in which the first through hole and the second through hole are provided on a side opposite to the photodiode, with respect to the TFT, but the configuration is not limited to this example. Alternatively, the first through hole and the second through hole may be provided above the TFT, or may be provided on the photodiode side with respect to the TFT.

(7) Embodiments 1 and 2 are described above with reference to an example in which the first through hole and the second through hole are provided at positions that overlap with each other when viewed in a plan view, but the configuration is not limited to this example. Alternatively, the first through hole and the second through hole may be formed at positions different from each other (positions displaced from each other) when viewed in a plan view.

(8) Regarding Embodiments 1 and 2 described above, the first through hole and the second through hole are illustrated in FIG. 3 as having a round shape, but the configuration is not limited to this example. Alternatively, the first through hole and the second through hole may be formed in a rectangular shape, in an elliptical shape, or in a slit-like shape.

(9) Embodiments 1 and 2 are described above with reference to an example in which both of the first through hole and the second through hole are provided in the photoelectric conversion panel, but the configuration is not limited to this example. Alternatively, only the first through hole may be provided in the photoelectric conversion panel.

(10) Embodiments 1 and 2 are described above with reference to an example in which the first through hole and the second through hole are formed in a round shape, but the configuration is not limited to this example. Alternatively, as is the case with the photoelectric conversion panel 301 of the modification example illustrated in FIG. 23, the first through hole GH21 and the second through hole GH22 are formed in a rectangular shape (a quadrangular shape). For example, the first through hole GH21 and the second through hole GH22 are formed at a position overlapping with the gate line 12 when viewed in a plan view.

The above-described photoelectric conversion panel, and the method for manufacturing the photoelectric conversion panel, can be described as follows.

A photoelectric conversion panel according to the first configuration includes: a thin film transistor; a first organic film formed in an upper layer with respect to the thin film transistor; a photoelectric conversion element formed in an upper layer with respect to the first organic film; a first inorganic layer formed so as to cover at least a part of the photoelectric conversion element, and to cover the first organic film; and a second organic film formed in an upper layer with respect to the first organic film, wherein the first inorganic layer includes a first through hole connecting the first organic film and the second organic film (the first configuration).

The first configuration makes it possible to release gas through the first through hole to the second organic film side, even in a case where heat for forming the second organic film is transmitted to the first organic film, thereby causing gas to be generated from the first organic film, in the manufacture of the photoelectric conversion panel. Then, this gas can be released through the second organic film from the photoelectric conversion panel to outside. This restrains gas from accumulating in between the first inorganic layer and the second organic film. As a result, it is possible to restrain the first inorganic layer from separating from the first organic film in the manufacture of the photoelectric conversion panel, even in a case where the photoelectric conversion panel includes the first organic film and the second organic film.

The first configuration may be further characterized in that the photoelectric conversion element includes a pair of electrodes, and a semiconductor layer provided between the pair of electrodes, and the first inorganic layer includes a first inorganic insulating film that covers at least a part of a lower electrode of the pair of electrodes, the lower electrode being connected to the thin film transistor, and includes a first inorganic insulating film having a first hole portion that composes at least a part of the first through hole (the second configuration).

With the second configuration, gas from the first organic film can be released through the first hole portion (the first through hole) of the first inorganic insulating film to the second organic film side. This restrains gas from accumulating in between the lower electrode (photoelectric conversion element) and the first organic film. As a result, it is possible to restrain the lower electrode (photoelectric conversion element) from separating from the first organic film.

The second configuration may be further characterized in that the first inorganic layer further includes a second inorganic insulating film that covers at least a part of the first inorganic insulating film and has a second hole portion that composes at least a part of the first through hole (the third configuration).

The third configuration enables to release gas from the first organic film to the second organic film side through the first hole portion of the first inorganic insulating film and the second hole portion (the first through hole) of the second inorganic insulating film, in the manufacture of the photoelectric conversion panel, even in a case where the second inorganic insulating film covering at least a part of the first inorganic insulating film is provided in the photoelectric conversion panel.

The third configuration may be further characterized in that the second hole portion is provided in the second inorganic insulating film, at a position overlapping with the first hole portion when viewed in a plan view (the fourth configuration).

The fourth configuration allows the first hole portion and the second hole portion to be easily connected, thereby making it possible to form the first through hole in the photoelectric conversion panel easily.

The fourth configuration may be further characterized in that the second inorganic insulating film is formed so as to cover at least a part of the photoelectric conversion element, and is provided with the second hole portion at a position that does not overlap with the photoelectric conversion element when viewed in a plan view, and the second organic film covers at least a part of the second inorganic insulating film, and is filled in the second hole portion (the fifth configuration).

This fifth configuration allows the first organic film and the second organic film to be easily connected, even in a case where the photoelectric conversion element is provided in the photoelectric conversion panel. As a result, it is possible to easily release gas from the first organic film to the second organic film side in the manufacture of the photoelectric conversion panel.

The fourth or fifth configuration may be further characterized in that the first hole portion having a first diameter is provided in the first inorganic insulating film, and the second hole portion having a second diameter equal to the first diameter is provided in the second inorganic insulating film (the sixth configuration).

The sixth configuration enables to collectively etching the first inorganic insulating film and the second inorganic insulating film in the manufacture of the photoelectric conversion panel, thereby making it possible to collectively form the first hole portion and the second hole portion. As a result, it is possible to restrain the process of manufacturing the photoelectric conversion panel from becoming complicated, even in a case where the first hole portion and the second hole portion are formed.

Any of the first to sixth configurations may be further characterized in further including a third organic film formed in an upper layer with respect to the second organic film, and a second inorganic layer that is formed so as to cover the second organic film and in which a second through hole for connecting the second organic film and the third organic film is provided (the seventh configuration).

The seventh configuration enables to release gas generated from the second organic film to the third organic film side through the second through hole in the manufacture of the photoelectric conversion panel, even in a case where the third organic film is provided in the photoelectric conversion panel. Then, gas can be released through the third organic film from the photoelectric conversion panel to outside. As a result, it is possible to restrain the second inorganic layer from separating from the second organic film.

The seventh configuration may be further characterized in that the second through hole is provided in the second inorganic layer, at a position overlapping with the first through hole when viewed in a plan view (the eighth configuration).

The eighth configuration makes it possible to form the second through hole easily, as compared with a case where the second through hole is formed at a position different from that of the first through hole when viewed in a plan view.

Any one of the first to eighth configurations may be further characterized in that the thin film transistor contains In—Ga—Zn—O-based oxide semiconductor, and the first inorganic layer contains silicon nitride (the ninth configuration).

With the ninth configuration, the oxidation by the first organic film with respect to the thin film transistor, and the reduction by the first inorganic film with respect to the thin film transistor, are optimized, which enables to restrain the thin film transistor from having current-voltage characteristics of the depletion mode.

A method for manufacturing a photoelectric conversion panel according to the tenth configuration includes: forming a thin film transistor; forming a first organic film in an upper layer with respect to the thin film transistor; forming a photoelectric conversion element in an upper layer with respect to the first organic film; a first inorganic layer formed so as to cover at least a part of the photoelectric conversion element, and to cover the first organic film; and a second organic film formed in an upper layer with respect to the first organic film, wherein the forming of the first inorganic layer includes providing a through hole connecting the first organic film and the second organic film, in the first inorganic layer (the tenth configuration).

With the tenth configuration, it is possible to provide a method for manufacturing a photoelectric conversion panel that makes it possible to restrain the first inorganic layer from separating from the first organic film in the manufacture of the photoelectric conversion panel, even in a case where the photoelectric conversion panel includes the first organic film and the second organic film.

The method for manufacturing a photoelectric conversion panel according to the tenth configuration may be further characterized in that: the forming of the photoelectric conversion element includes: forming a lower electrode connected to the thin film transistor; and forming a semiconductor layer, and an upper electrode that, together with the lower electrode, interposes the semiconductor layer, the forming of the first inorganic layer includes: forming a first inorganic insulating film that covers at least a part of the first organic film and covers at least a part of the lower electrode, and the providing of the through hole includes forming, in the first inorganic insulating film, a first hole portion that composes at least a part of the through hole (the eleventh configuration).

With the eleventh configuration, gas from the first organic film can be released through the first hole portion (the first through hole) of the first inorganic insulating film to the second organic film side.

The method for manufacturing a photoelectric conversion panel according to the eleventh configuration may be further characterized in that: the forming of the first inorganic layer includes: forming a second inorganic insulating layer that covers at least a part of the first inorganic insulating film in which the first hole portion is formed, and at least a part of the photoelectric conversion element; and the providing of the through hole includes forming a second hole portion that composes at least a part of the through hole, in the second inorganic insulating layer, at a position overlapping with the first hole portion when viewed in a plan view (the twelfth configuration).

The twelfth configuration allows the first hole portion and the second hole portion to be easily connected, thereby making it possible to form the first through hole in the photoelectric conversion panel easily.

The method for manufacturing a photoelectric conversion panel according to the eleventh configuration may be further characterized in that: the forming of the first inorganic layer includes: forming a second inorganic insulating film that covers at least a part of the first inorganic insulating film in which the first hole portion is formed, and at least a part of the photoelectric conversion element; and the providing of the through hole includes providing a through hole by etching a part of the first inorganic insulating film and a part of the second inorganic insulating film together (the thirteenth configuration).

The thirteenth configuration makes it possible to form the first hole portion and the second hole portion collectively, thereby restraining the process of manufacturing the photoelectric conversion panel from becoming complicated, even in a case where the first hole portion and the second hole portion are formed.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A photoelectric conversion panel comprising:
   a thin film transistor;
   a first organic film formed in an upper layer with respect to the thin film transistor;
   a photoelectric conversion element formed in an upper layer with respect to the first organic film;
   a first inorganic layer formed so as to cover at least a part of the photoelectric conversion element, and to cover the first organic film; and
   a second organic film formed in an upper layer with respect to the first organic film,
   wherein the first inorganic layer includes a first through hole connecting the first organic film and the second organic film.

2. The photoelectric conversion panel according to claim 1,
   wherein the photoelectric conversion element includes a pair of electrodes, and a semiconductor layer provided between the pair of electrodes, and
   the first inorganic layer includes a first inorganic insulating film that covers at least a part of a lower electrode connected to the thin film transistor, the lower electrode being one of the pair of electrodes, and that includes a first hole portion that composes at least a part of the first through hole.

3. The photoelectric conversion panel according to claim 2,
   wherein the first inorganic layer further includes a second inorganic insulating film that covers at least a part of the first inorganic insulating film and has a second hole portion that composes at least a part of the first through hole.

4. The photoelectric conversion panel according to claim 3,
   wherein the second hole portion is provided in the second inorganic insulating film, at a position overlapping with the first hole portion when viewed in a plan view.

5. The photoelectric conversion panel according to claim 4,
   wherein the second inorganic insulating film is formed so as to cover at least a part of the photoelectric conversion element, and is provided with the second hole portion at a position that does not overlap with the photoelectric conversion element when viewed in a plan view, and
   the second organic film covers at least a part of the second inorganic insulating film and is filled in the second hole portion.

6. The photoelectric conversion panel according to claim 4,
   wherein the first inorganic insulating film is provided with the first hole portion having a first diameter, and
   the second inorganic insulating film is provided with the second hole portion having a second diameter equal to the first diameter.

7. The photoelectric conversion panel according to claim 1, further comprising:
   a third organic film formed in an upper layer with respect to the second organic film; and
   a second inorganic layer that is formed so as to cover the second organic film, and that is provided with a second through hole that connects the second organic film and the third organic film.

8. The photoelectric conversion panel according to claim 7,
   wherein the second through hole is provided in the second inorganic layer, at a position overlapping with the first through hole when viewed in a plan view.

9. The photoelectric conversion panel according to claim 1,
   wherein the thin film transistor contains In—Ga—Zn—O-based oxide semiconductor, and
   the first inorganic layer contains silicon nitride.

10. A method for manufacturing a photoelectric conversion panel comprising:
    forming a thin film transistor;
    forming a first organic film in an upper layer with respect to the thin film transistor;
    forming a photoelectric conversion element in an upper layer with respect to the first organic film;
    a first inorganic layer formed so as to cover at least a part of the photoelectric conversion element, and to cover the first organic film; and
    a second organic film formed in an upper layer with respect to the first organic film,
    wherein the forming of the first inorganic layer includes providing a through hole connecting the first organic film and the second organic film, in the first inorganic layer.

11. The method for manufacturing a photoelectric conversion panel according to claim 10,
    the forming of the photoelectric conversion element includes: forming a lower electrode connected to the thin film transistor; and forming a semiconductor layer, and an upper electrode that, together with the lower electrode, interposes the semiconductor layer,
    the forming of the first inorganic layer includes: forming a first inorganic insulating film that covers at least a part of the first organic film and covers at least a part of the lower electrode, and
    the providing of the through hole includes forming, in the first inorganic insulating film, a first hole portion that composes at least a part of the through hole.

12. The method for manufacturing a photoelectric conversion panel according to claim 11,
    wherein the forming of the first inorganic layer includes: forming a second inorganic insulating layer that covers at least a part of the first inorganic insulating film in which the first hole portion is formed, and at least a part of the photoelectric conversion element; and
    the forming of the through hole includes forming a second hole portion that composes at least a part of the through hole, in the second inorganic insulating layer, at a position overlapping with the first hole portion when viewed in a plan view.

13. The method for manufacturing a photoelectric conversion panel according to claim 11,
    wherein the forming of the first inorganic layer includes: forming a second inorganic insulating film that covers at least a part of the first inorganic insulating film in which the first hole portion is formed, and at least a part of the photoelectric conversion element; and
    the providing of the through hole includes providing a through hole by etching a part of the first inorganic insulating film and a part of the second inorganic insulating film together.

* * * * *